(12) United States Patent
Tseng (10) Patent No.: US 10,637,414 B2
(45) Date of Patent: Apr. 28, 2020

(54) LOW-IMPEDANCE REFERENCE VOLTAGE GENERATOR

(71) Applicant: Intel Corporation, Santa Clara, CA (US)

(72) Inventor: Richard Y. Tseng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 708 days.

(21) Appl. No.: 15/056,994

(22) Filed: Feb. 29, 2016

(65) Prior Publication Data
US 2016/0182095 A1    Jun. 23, 2016

Related U.S. Application Data

(63) Continuation of application No. 13/995,474, filed as application No. PCT/US2012/029444 on Mar. 16, 2012, now Pat. No. 9,724,536.

(51) Int. Cl.
| | |
|---|---|
| H03F 3/24 | (2006.01) |
| G05F 1/565 | (2006.01) |
| G05F 1/59 | (2006.01) |
| G05F 1/46 | (2006.01) |
| H03F 3/45 | (2006.01) |

(52) U.S. Cl.
CPC .............. *H03F 3/24* (2013.01); *G05F 1/465* (2013.01); *G05F 1/468* (2013.01); *G05F 1/565* (2013.01); *G05F 1/59* (2013.01); *H03F 3/45179* (2013.01); *H03F 3/45192* (2013.01); *H03F 2200/151* (2013.01); *H03F 2203/45114* (2013.01); *H03F 2203/45151* (2013.01)

(58) Field of Classification Search
CPC .... H03F 3/24; H03F 3/45192; H03F 3/45179; H03F 2203/45151; H03F 2203/45114; H03F 2200/151; G05F 1/465; G05F 1/59; G05F 1/565
See application file for complete search history.

(56) References Cited

U.S. PATENT DOCUMENTS

| | | | |
|---|---|---|---|
| 4,833,342 A * | 5/1989 | Kiryu ...................... | G05F 3/247 323/313 |
| 4,918,336 A | 4/1990 | Graham et al. | |
| 4,928,056 A | 5/1990 | Pease | |
| 5,025,181 A * | 6/1991 | Farmer ............ | H03K 19/00361 327/404 |

(Continued)

FOREIGN PATENT DOCUMENTS

WO      2013137910       9/2013

OTHER PUBLICATIONS

Corrected Notice of Allowance dated Jan. 14, 2016, for U.S. Appl. No. 13/995,474.

(Continued)

*Primary Examiner* — Thomas J. Hiltunen
(74) *Attorney, Agent, or Firm* — Green, Howard & Mughal LLP (57) ABSTRACT

Described herein is an apparatus and system of a low-impedance reference voltage generator. The apparatus comprises: a voltage-control loop including a first transistor to provide an output voltage; and a current-control loop to sense current through the first transistor, relative to a reference current. The node having the output voltage is a low-impedance node.

20 Claims, 5 Drawing Sheets

(56) References Cited

U.S. PATENT DOCUMENTS

| | | | |
|---|---|---|---|
| 5,061,981 A * | 10/1991 | Hall | H01L 27/0727 |
| | | | 257/327 |
| 5,177,676 A | 1/1993 | Inam et al. | |
| 5,300,898 A * | 4/1994 | Chen | H03K 19/01721 |
| | | | 327/101 |
| 5,317,254 A | 5/1994 | Olson | |
| 5,357,149 A | 10/1994 | Kimura | |
| 5,557,193 A | 9/1996 | Kajimoto | |
| 5,610,547 A | 3/1997 | Koyama et al. | |
| 5,796,296 A * | 8/1998 | Krzentz | G05F 3/247 |
| | | | 327/530 |
| 5,835,420 A * | 11/1998 | Lee | G11C 5/147 |
| | | | 365/189.07 |
| 5,898,235 A * | 4/1999 | McClure | G11C 5/147 |
| | | | 307/64 |
| 6,018,272 A | 1/2000 | Marsh et al. | |
| 6,271,710 B1 * | 8/2001 | Ooishi | G05F 3/262 |
| | | | 323/315 |
| 6,384,671 B1 | 5/2002 | Taguchi et al. | |
| 6,411,126 B1 * | 6/2002 | Tinsley | H03K 17/6871 |
| | | | 326/115 |
| 6,433,521 B1 | 8/2002 | Chen et al. | |
| 6,441,594 B1 * | 8/2002 | Connell | G05F 1/575 |
| | | | 323/274 |
| 6,563,369 B1 | 5/2003 | Comer et al. | |
| 6,775,112 B1 * | 8/2004 | Smith | G05F 1/613 |
| | | | 361/111 |
| 6,812,777 B2 | 11/2004 | Tamura et al. | |
| 6,922,099 B2 | 7/2005 | Shor | |
| 6,980,046 B2 | 12/2005 | Soe | |
| 7,091,709 B2 | 8/2006 | Suzuki | |
| 7,173,402 B2 | 2/2007 | Chen et al. | |
| 7,215,201 B2 * | 5/2007 | Roine | H03F 3/45264 |
| | | | 330/255 |
| 7,248,025 B2 | 7/2007 | Adachi | |
| 7,248,531 B2 | 7/2007 | Pyeon et al. | |
| 7,402,985 B2 * | 7/2008 | Zlatkovic | G05F 1/56 |
| | | | 323/270 |
| 7,504,814 B2 | 3/2009 | Lee et al. | |
| 7,504,878 B2 * | 3/2009 | Lin | G05F 1/567 |
| | | | 323/313 |
| 7,554,309 B2 | 6/2009 | Carpenter et al. | |
| 7,558,097 B2 * | 7/2009 | Khellah | G11C 11/413 |
| | | | 365/154 |
| 7,863,873 B2 | 1/2011 | Hou et al. | |
| 8,044,653 B2 | 10/2011 | Maige et al. | |
| 8,126,515 B2 * | 2/2012 | Watanabe | G06K 19/0723 |
| | | | 307/149 |
| 8,154,263 B1 | 4/2012 | Shi et al. | |
| 8,294,442 B2 | 10/2012 | Zhu | |
| 8,305,066 B2 | 11/2012 | Lin et al. | |
| 8,314,651 B2 * | 11/2012 | Song | G05F 1/56 |
| | | | 327/538 |
| 8,423,096 B1 | 4/2013 | Rao et al. | |
| 8,432,144 B2 | 4/2013 | Notani | |
| 8,461,812 B2 * | 6/2013 | Kim | G05F 1/613 |
| | | | 323/225 |
| 8,531,237 B2 * | 9/2013 | Aisu | G05F 1/575 |
| | | | 323/273 |
| 8,981,747 B2 | 3/2015 | Saito | |
| 9,104,221 B2 | 8/2015 | Kim | |
| 9,274,536 B2 * | 3/2016 | Tseng | G05F 3/24 |
| 2002/0135339 A1 * | 9/2002 | Tang | G06F 1/305 |
| | | | 323/274 |
| 2003/0011350 A1 | 1/2003 | Gregorius | |
| 2005/0093616 A1 | 5/2005 | Hung | |
| 2005/0104642 A1 * | 5/2005 | Mitsumoto | H03K 3/012 |
| | | | 327/212 |
| 2005/0280453 A1 | 12/2005 | Hsieh | |
| 2006/0055480 A1 | 3/2006 | Darrer et al. | |
| 2006/0132107 A1 | 6/2006 | Sicard | |
| 2007/0194809 A1 | 8/2007 | Tadeparthy | |
| 2008/0084246 A1 * | 4/2008 | Galal | H03F 1/301 |
| | | | 330/290 |
| 2009/0315624 A1 * | 12/2009 | Chow | H03F 1/34 |
| | | | 330/291 |
| 2011/0248688 A1 | 10/2011 | Iacob et al. | |
| 2011/0291759 A1 * | 12/2011 | Song | H03F 3/45192 |
| | | | 330/253 |
| 2011/0307724 A1 | 12/2011 | Shaw et al. | |
| 2013/0033247 A1 | 2/2013 | Endo et al. | |
| 2013/0119954 A1 | 5/2013 | Lo | |
| 2014/0167821 A1 * | 6/2014 | Yang | H03F 3/45197 |
| | | | 327/108 |

OTHER PUBLICATIONS

Corrected Notice of Allowance dated Dec. 23, 2015, for U.S. Appl. No. 13/995,474.

Final Office Action dated Jul. 21, 2015, for U.S. Appl. No. 13/995,474.

Final Office Action dated Nov. 21, 2014, for U.S. Appl. No. 13/995,474.

First Office Action, dated Jul. 12, 2013, for Chinese Utility Model Patent Application No. 201320256745.5.

International Search Report and Written Opinion, dated Nov. 29, 2012, for PCT Patent Application No. PCT/US2012/029444.

Non-Final Office Action dated Apr. 10, 2015 for U.S. Appl. No. 13/995,474.

Non-Final Office Action dated Jul. 16, 2014, for U.S. Appl. No. 13/995,474.

Notice of Allowance dated Oct. 31, 2015, for U.S. Appl. No. 13/995,474.

Notice of Allowance, dated Oct. 24, 2013, for Chinese Utility Model Patent Application No. 201320256745.5.

Office Action, dated Dec. 10, 2015, for Russian Patent Application No. 2014139408.

Ahuja, B. et al., "A Programmable CMOS Dual Channel Interface Processor for Telecommunications Applications", IEEE Journal of Solid-State Circuits, vol. SC-19, No. 6, Dec. 198, pp. 892-899 (8 pages).

Brehmer, K. et al., "Large Swing CMOS Power Amplifier", IEEE Journal of Solid-State Circuits, vol. SC-18, No. 6, Dec. 1983, pp. 624-629 (6 pages).

Fisher, J. "A High-Performance CMOS Power Amplifier", IEEE Journal of Solid-State Circuits, vol. SC-20, No. 6, Dec. 1985, pp. 1200-1205 (6 pages).

Khorramabadi, H. "A CMOS Line Driver with 80-dB Linearity for ISDN Applications", IEEE Journal of Solid-State Circuits, vol. 27, No. 4, Apr. 1992, pp. 549-544 (6 pages).

Intention to Grant from European Patent Application No. 12870990.4 dated Dec. 18, 2018, 6 pgs.

* cited by examiner

LOW-IMPEDANCE REFERENCE VOLTAGE GENERATOR

CLAIM OF PRIORITY

This application claims priority to U.S. patent application Ser. No. 13995474, filed on 18 Jun. 2013, titled "A LOW-IMPEDANCE REFERENCE VOLTAGE GENERATOR", issued on 1 Mar. 2016, as U.S. Pat. No. 9,724,536, which claims the benefit of priority of PCT Application No. PCT/US2012/029444 filed Mar. 16, 2012, titled "A LOW-IMPEDANCE REFERENCE VOLTAGE GENERATOR," and which are incorporated by reference in entirety.

BACKGROUND

Circuits that provide low-impedance reference voltages have high power consumption. For example, at a supply voltage of 1V, traditional low-impedance reference generators can consume more than 5 mA to provide a low-impedance reference voltage. Today's computers and analog circuits operate at low supply voltages and are preferred to have low power consumption and size, which makes the use of traditional low-impedance reference generators a challenge.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Providing low-impedance reference voltages at low power consumption is a well known challenge. The embodiments herein relate to an apparatus and system of a low-impedance reference voltage generator which consumes substantially less power consumption compared to traditional reference generators.

The embodiments described herein use the trans-conductance of output transistors to achieve low output impedance. In one embodiment, with a high trans-conductance to current ratio ($g_m:I_d$), quiescent current is decreased in the output transistors of the low-impedance reference generator compared to traditional voltage generators. A high $g_m:I_d$ ratio would be approximately 15:1 for n-channel or p-channel metal-oxide-semiconductor (NMOS/PMOS) devices and a low $g_m:I_d$ ratio would be approximately 6:1. The $g_m:I_d$ ratio for bipolar junction transistors (BJT) at room temperature is fixed at approximately 40:1.

In the embodiments discussed herein, a current-sense and current-control loop is applied in addition to voltage-control loop to provide a low-impedance reference voltage. The current-control loop discussed herein fixes the quiescent current through the output transistors, decoupling them from the value of the bias voltage. In the embodiments discussed herein, common-source (or common-emitter) transistors are used in the current-control loop to avoid the limited output range issues observed in traditional push-pull based source-follower (or emitter-follower) reference voltage circuit topologies, resulting in a wide output voltage range. For example, the output voltage range is approximately 600 mV for the circuit discussed herein when it is designed in a process with a 1V power supply voltage. In contrast, the output voltage range of a push-pull stage designed in a process with a 1V supply voltage has an output range of approximately 300 mV. The common-source transistor discussed herein also provides the means to control/adjust the quiescent current.

In one embodiment, the apparatus comprises: a voltage-control loop including a first transistor to provide an output voltage; and a current-control loop to sense the current through the first transistor, relative to a reference current. In one embodiment, the current-control loop comprises a second transistor, coupled in series with the first transistor, the second transistor to provide the constant current through the first and second transistors.

In one embodiment, the apparatus comprises a first capacitor with a first node coupled to an output of a second amplifier of the current-control loop and the input of the second transistor, and a second node coupled to a terminal of the first transistor and the second transistor. In one embodiment, the apparatus further comprises: a second capacitor with a first node coupled to an output of a first amplifier of the voltage-control loop, and a second node coupled to a supply node or ground. In one embodiment, the first transistor is a source-follower (or emitter-follower), and wherein the second transistor is a common-source (or common-emitter transistor).

In one embodiment, the first amplifier is operable to provide an output voltage relative to a reference voltage, via the first transistor coupled to the first amplifier. In one embodiment, the second amplifier is operable to generate an input signal for the second transistor, coupled in series with the first transistor, the second transistor to provide constant current through the first and second transistors, relative to a reference current.

In one embodiment, the first capacitor with the first node is coupled to an output of the second amplifier and input of the second transistor. In one embodiment, the second node of the first capacitor is coupled to a terminal of the first transistor and a terminal of the second transistor, wherein the second node of the first capacitor is coupled to an input of the first amplifier, the second node of the first capacitor providing a reference voltage. In one embodiment, the first node of the second capacitor is coupled to an output of the first amplifier and an input of the first transistor, wherein the second capacitor has a second node coupled to a supply node or ground.

In one embodiment, the apparatus further comprises a first resistor with a first node coupled to a first input of the second amplifier and a terminal of the first transistor. In one embodiment, the apparatus further comprises a second resistor with a first node coupled to a second input of the second amplifier and a reference current generator that provides the reference current.

In one embodiment, the system comprises: a processor having a reference generator according to the apparatus described herein; and a wireless antenna to communicatively link the processor to a wireless network. In one embodiment, the reference generator is operable to provide at least one of: a common mode voltage to termination resistors of an input-output (I/O) receiver, a reference voltage for an I/O transmitter, or a reference voltage for an analog circuit. In one embodiment, the I/O receiver is a PCIe I/O receiver that meets the specification described in the Peripheral Component Interconnect Express (PCIe) Base Specification, for example, the Peripheral Component Interconnect Express (PCIe) Base Specification Revision 3.0, Version 0.9, Aug. 10, 2010. In one embodiment, the system further comprises a display unit which is a touch screen.

The technical effects of the embodiments discussed herein are many. For example, the embodiments of the low-impedance reference voltage generator discussed herein provide a common mode (CM) return loss of −6 dB over zero to 4 GHz frequency range and a −3 dB above 4 GHz. The low-impedance reference generator discussed herein provides a low-impedance reference voltage at less than half of the power consumption of traditional low-impedance reference voltage generators.

For example, the low-impedance reference generator discussed herein, consumes 2 mA compared to more than 5 mA consumed by traditional low-impedance reference voltage generators. That the low-impedance reference voltage generator discussed herein provides a wide output voltage range and constant quiescent power consumption over process, temperature, and supply voltage (PVT) variations, as well as different output voltages, increases it's reusability for general purpose analog circuit design. Other technical effects are contemplated by the embodiments discussed herein.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

For purposes of the embodiments described herein, the transistors are metal oxide semiconductor (MOS) transistors, which include drain, source, gate, and bulk terminals. Source and drain terminals are identical terminals and are interchangeably used herein. Those skilled in the art will appreciate that other transistors (Bi-polar junction transistors—BJT PNP/NPN, BiCMOS, CMOS, eFET, etc) may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

Figure 1:
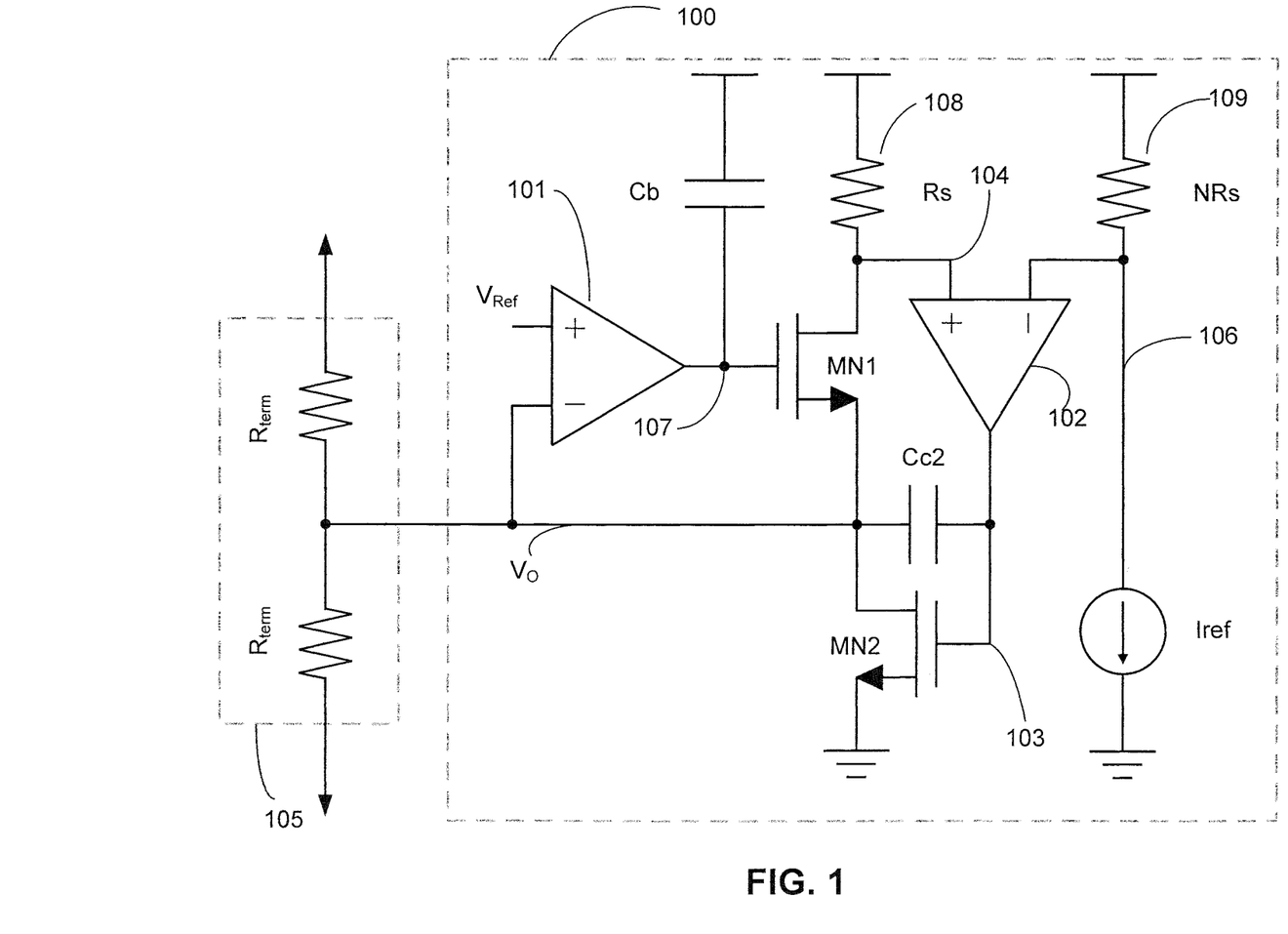
FIG. 1 is a circuit of a low-impedance reference voltage generator, according to one embodiment of the disclosure.

FIG. 1 is a circuit of a low-impedance reference voltage generator 100, according to one embodiment of the disclosure. In one embodiment, the low-impedance reference voltage generator 100 comprises: a voltage-control loop including a first transistor MN1 to provide an output voltage at node Vo. The voltage-control loop is indicated by the circuit loop formed from a first amplifier 101, the first transistor MN1, and the output voltage node Vo. In one embodiment, the low-impedance reference voltage generator 100 further comprises a current-control loop to sense current through the first transistor MN1, relative to a reference current Tref. In one embodiment, the current-control loop comprises a second transistor MN2, coupled in series with the first transistor MN1, the second transistor MN2 to provide the constant current through the first and second transistors (MN1 and MN2 respectively). The current-control loop is indicated by the circuit loop formed from a second amplifier 102, the second transistor MN2, the first transistor MN1, and the voltage node Vo.

In one embodiment, the first transistor MN1 is a source-follower or emitter-follower, while the second transistor MN2 is a common-source or common-emitter transistor. The first and second amplifiers 101 and 102 respectively are single stage or multiple stage operational-amplifiers (OPAMPs). In one embodiment, the first and second amplifiers 101 and 102 minimize the voltage difference between Vo and Vref, and the voltage difference between nodes 104 and 106, respectively. In one embodiment, the transistors of first and second amplifiers are matched to cancel systematic errors caused by variations in process, temperature, and voltage (PVT).

In one embodiment, the low-impedance reference voltage generator comprises a first capacitor Cc2 with a first node 103 coupled to an output of the second amplifier 102 of the current-control loop. In this embodiment, the first node 103 of the first capacitor Cc2 is also coupled to the input of the second transistor MN2. The input of the second transistor MN2 is a gate terminal when the second transistor MN2 is an NMOS transistor. Likewise, the input of the second transistor MN2 is a base terminal when the second transistor MN2 is an NPN BJT transistor.

In one embodiment, a second node Vo of the first capacitor Cc2 is coupled to a terminal of the first transistor MN1. In this embodiment, the terminal of the first transistor MN1 which is coupled to the second node of the first capacitor Cc2 is the source terminal (when MN1 is an NMOS transistor) or emitter terminal (when MN1 is an NPN BJT transistor).

In one embodiment, the second terminal (coupled to output node Vo) of the first capacitor Cc2 is also coupled to a terminal of the second transistor. In this embodiment, the terminal of the second transistor MN2 which is coupled to the second node of the first capacitor Cc2 is the drain terminal (when MN2 is an NMOS transistor) or collector terminal (when MN2 is an NPN BJT transistor). In one embodiment, the second node (coupled to output node Vo) of the first capacitor Cc2 is coupled to an input of the first amplifier 101, the second node (coupled to output node Vo) providing the output low-impedance reference voltage. In this embodiment, the input of the first amplifier 101 which is coupled to output node Vo is the negative input of the first amplifier 101, while a reference voltage Vref is coupled to the positive terminal of the first amplifier 101. In one embodiment, the first capacitor Cc2 has a capacitance in the range of 500 fF to 1 pF.

Figure 4:
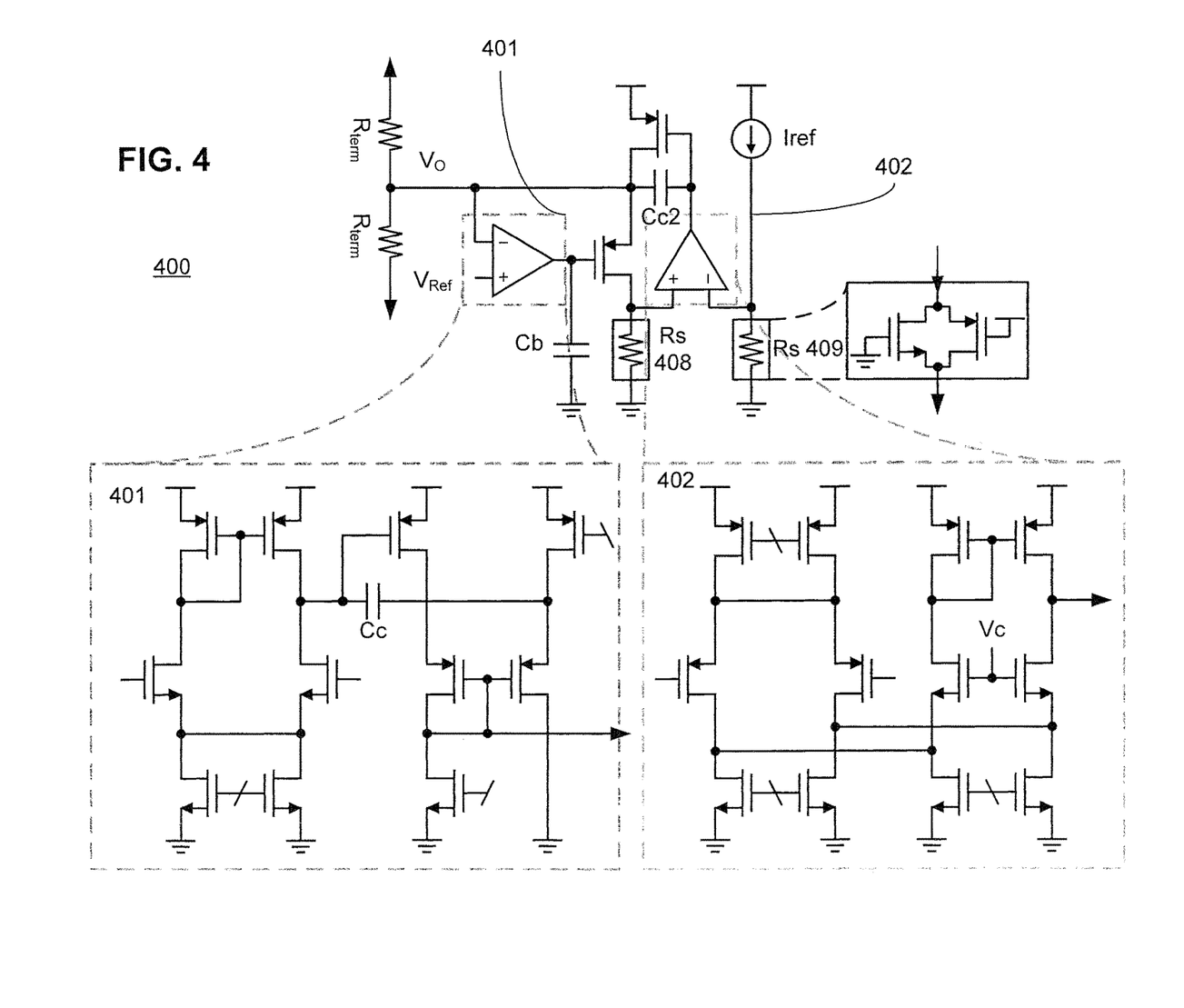
FIG. 4 is a circuit of a low-impedance reference voltage generator, according to another embodiment of the disclosure.

In one embodiment, the low-impedance reference voltage generator 100 further comprises a second capacitor Cb with a first node 107 coupled to an output of a first amplifier MN1 of the voltage-control loop, and a second node coupled to a supply node Vcc (or ground for FIG. 4). Referring back to FIG. 1, in one embodiment the first node 107 of the second capacitor Cb is coupled to an input of the first transistor MN1. The input of the first transistor MN1 is a gate terminal when the first transistor MN1 is an NMOS transistor. Likewise, the input of the first transistor MN1 is a base terminal when the first transistor MN1 is an NPN BJT transistor. In one embodiment, the second capacitor Cb has a capacitance around 1 pF.

In one embodiment, the first amplifier 101 is operable to provide the output voltage Vo (interchangeably referred to as output node Vo) relative to a reference voltage Vref, via the first transistor MN1 coupled to the first amplifier 101. In one embodiment, the reference voltage Vref can be generated by any known source. For example, Vref may be generated by a bandgap circuit, a voltage divider, etc. Though the range of Vref is application specific, in a process with a 1V supply, a typical Vref may have a range from 50 mV to 650 mV.

In one embodiment, the second amplifier 102 is operable to cause a constant current, through the first transistor MN1, relative to the reference current Tref. In one embodiment, Tref is generated by any known current reference generator. In one embodiment, the second amplifier 102 is operable to generate an input signal 103 for the second transistor MN2, coupled in series with the first transistor MN1, the second transistor MN2 to provide the constant current through the first and second transistors MN1 and MN2 respectively.

In one embodiment, the low-impedance reference voltage generator 100 further comprises a first resistor 108 including a first node 104 coupled to a first input of the second amplifier 102 and a terminal of the first transistor MN1. In this embodiment, the terminal of the first transistor MN1 which is coupled to the first resistor 108 is the drain terminal 104 of MN1 (or collector terminal, when MN1 is a BJT). In one embodiment, the first input of the second amplifier 102 which is coupled to the terminal of the first transistor MN1 is a positive terminal of the second amplifier 102.

In one embodiment, the low-impedance reference voltage generator 100 further comprises a second resistor 109 including a first node 106 coupled to a second input of the second amplifier 102 and a reference current generator Tref that provides the reference current. In this embodiment, the second input of the second amplifier 102 is a negative terminal of the second amplifier 102. In one embodiment, the second resistor 109 has a resistance NRs which is a multiple of the first resistance Rs (of first resistor 108), where 'N' is an integer. In other embodiments, 'N' is a fraction.

While the embodiments herein show the first resistor 108 and second resistor 109 as discrete passive resistors, the first resistor 108 and second resistor 109 can be active devices. In one embodiment, the first resistor 108 and second resistor 109 are implemented as pass-gates with p-type transistors coupled in parallel to n-type transistors. In one embodiment, the first resistor 108 and second resistor 109 are implemented as n-type transistors. In one embodiment, the first resistor 108 and second resistor 109 are implemented as p-type transistors. In one embodiment, the n-type and p-type transistors forming the first resistor 108 and second resistor 109 have programmable resistance i.e., the n-type and p-type transistors can be turned on or off in any combination to provide the desired resistance. In one embodiment, the first resistor 108 and second resistor 109 have resistance of 150 Ohms.

In the embodiments discussed herein, the first resistor 108 and second resistor 109 are matched resistors. The term "matched" herein refers to identical layout of the resistors including integral multiple of identical layouts, resulting in the current-voltage characteristics of one device being a fixed multiple of the other. For example, the second resistor 109 has a resistance which is a fraction or multiple of the resistance of the first resistor 108.

In one embodiment, the output node Vo provides common mode return loss according to the PCIe Specification to the termination impedances 105 as shown in FIG. 1. In other embodiments, the output node Vo may be used for providing a reference voltage to other circuits. For example, the output node Vo may be used for providing a reference voltage to a transmitter circuit. As another example, the output node Vo may also be used to reduce coupling noise on a bias voltage line.

In one embodiment, a low-impedance bias signal is generated at the output node Vo by setting the quiescent current through the source-follower (or emitter-follower) transistor MN1 as well as setting the appropriate voltage at the gate terminal (or base) of the source-follower (or emitter follower) transistor MN1. In such an embodiment, the voltage-control loop formed by the first amplifier 101 in negative feedback compares the voltage at the source (node Vo) of the source-follower transistor MN1 to the reference voltage Vref. In this embodiment, the first amplifier 101 amplifies the difference between the voltage at the source (node Vo) and the reference voltage Vref. In one embodiment, the first amplifier 101 drives the gate terminal of the source-follower transistor MN1 to minimize (e.g., within 10 mV) the difference between the output voltage Vo and the reference voltage Vref. In one embodiment, the difference between the output voltage Vo and the reference voltage Vref is minimized to zero.

In one embodiment, while the voltage-control loop is minimizing the difference (e.g., bringing it within 10 mV) between the output voltage on node Vo and the reference voltage Vref, the current-control loop is operating simultaneously. In one embodiment, the quiescent current through the source-follower transistor MN1 is sensed through the first resistor 108 via the second amplifier 102.

In such an embodiment, the second amplifier 102 compares the current through the first resistor 108 with the reference current Tref which flows through the matched second resistor 109. In this embodiment, the difference between the currents through the first resistor 108 and a multiple of the reference current Tref is amplified by the second amplifier 102. In one embodiment, the second amplifier 102 is used to drive the gate (or base) terminal of the common-source (or common-emitter) transistor MN2 to minimize the difference between a multiple of the reference current Tref and the quiescent current of both the source-follower transistor MN1 and the common-source transistor MN2. In this embodiment, the voltage-control loop and the current-control loop fix both the output voltage at node Vo and the quiescent current through the first and second transistors MN1 and MN2 respectively. As explained herein, the voltage-control loop and the current-control loop lower the impedance of the bias signal at node Vo for all frequencies.

In one embodiment, at low frequencies, low-impedance at node Vo is achieved through the simultaneous operation of both the voltage-control feedback loop and the current-control feedback loop. The term "low frequencies" herein refers to frequencies less than 100 MHz or frequencies at which the capacitors Cb and Cc2 are functionally electrically open.

For example, when the voltage on the bias signal node Vo decreases, the negative feedback through the voltage-control loop forces the gate (or base) voltage at node 107 of the source-follower (or emitter-follower) transistor MN1 higher. As the gate (or base) voltage at node 107 of the source-follower (or emitter-follower) transistor MN1 (first transistor) is raised, the source-follower transistor MN1 sources more current to counteract the decrease in the voltage on the bias signal node Vo. At the same time, the increase in current through the source-follower (or emitter-follower) transistor MN1 is sensed by the current-control loop, which causes the common-source (or common-emitter) transistor MN2 (second transistor) to sink less current. In this embodiment, the current-control loop also counteracts the decrease in the voltage at the bias signal node Vo. An increase of the voltage on the bias signal node Vo produces a similar effect in both the voltage-control loop and the current-control loop.

At medium and high frequencies, the first capacitor Cc2 (also called bypass capacitor) and the second capacitor Cb (also called the decoupling capacitor) are shorted causing the loop gains through the first and second amplifiers 101 and 102 respectively to diminish. When the second capacitor Cc2 shorts, an impedance of $1/g_m$ is provided at node Vo, looking into the source (or emitter) node of first transistor MN1, and an impedance of $1/g_m$ is provided looking into the drain of second transistor MN2, where $g_m$ is the transconductance of first and second transistors MN1 and MN2 respectively. This results in an impedance that is proportional to $1/g_m$ at node Vo, looking into the circuit 100.

The term "medium and high frequencies" herein refers to frequencies greater than 100 MHz, or frequencies at which the capacitors Cb and Cc2 are functionally electrically shorted.

For example, when the voltage on the bias signal node Vo decreases, the source-follower transistor MN1 sources more current. At the same time, the gate voltage at node 103 of the common-source transistor MN2 decreases, thus causing transistor MN2 to sink less current. Both these actions counteract the decrease in bias signal voltage at the output node Vo. An increase of the voltage on the bias signal node Vo produces a similar effect in the first and second transistors MN1 and MN2 respectively.

Figure 2:
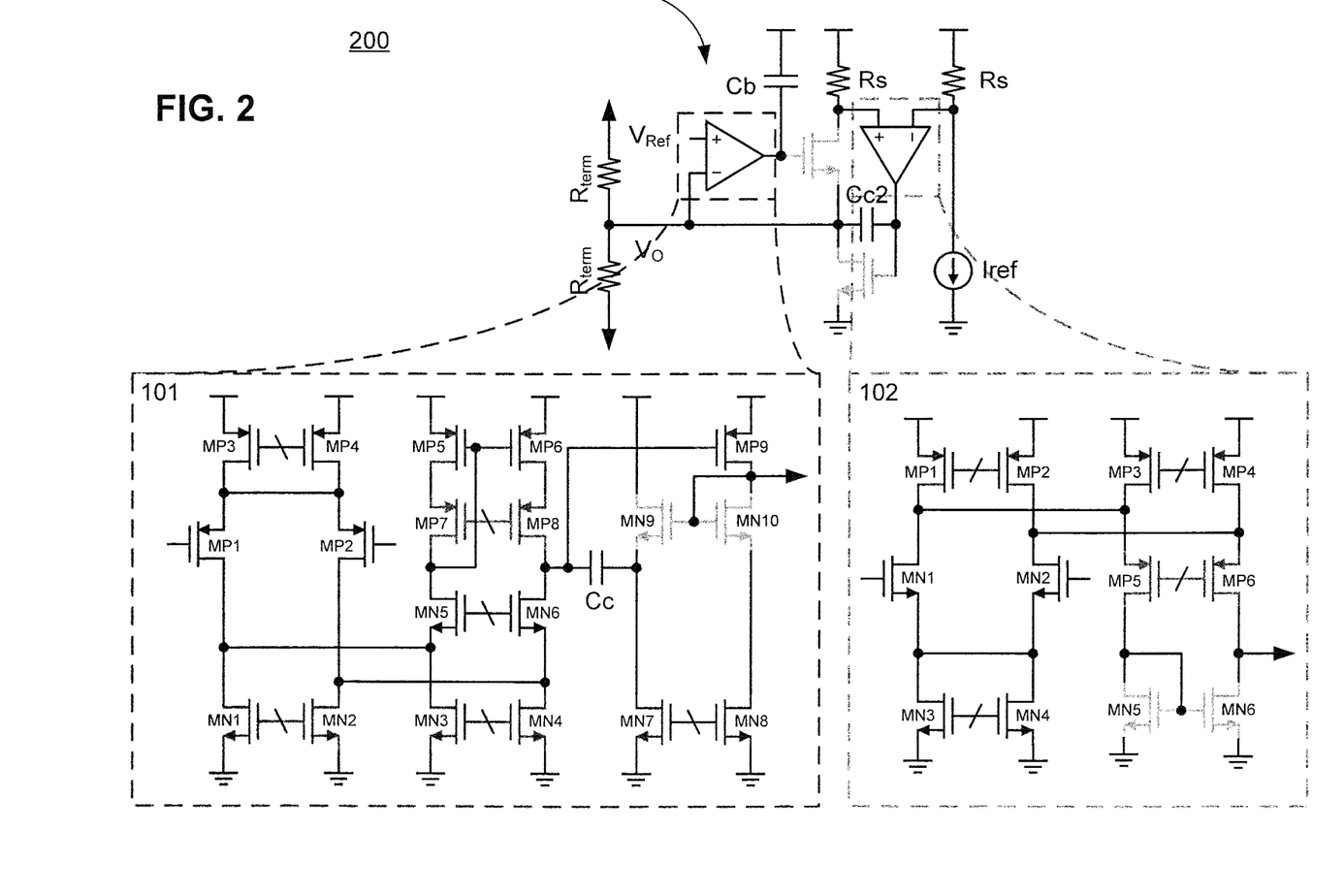
FIG. 2 is a schematic showing details of the circuit of FIG. 1, according to one embodiment of the disclosure.

FIG. 2 is a schematic 200 showing details of the circuit 100 of FIG. 1, according to one embodiment of the disclosure. FIG. 2 provides details of amplifier circuits that can be used for first and second amplifiers 101 and 102 respectively, according to one embodiment of the disclosure. In other embodiments, other circuits for the first and second amplifiers 101 and 102 may be used without changing the essence of the embodiments of the disclosure. So as not to obscure the embodiments of the disclosure, the operation of the first and second amplifier designs is not discussed. Slashes on transistor gates (e.g., slashes on the transistor gates MN3 and MN4) indicate that the transistor gate is connected to an appropriate biasing circuit. So as not to obscure the embodiments of the disclosure, biasing circuits are not shown.

In one embodiment, the first amplifier 101 comprises a p-type differential amplifier with input transistors MP1 and MP2. One reason for selecting p-type differential amplifier with input transistors MP1 and MP2 is to accommodate the low input common-mode voltage of the first amplifier 101, which is a result of the low output voltage requirement of Vo and Vref. In one embodiment, the n-type transistors MN9 and MN10 of the first amplifier 101 are matched with the source-follower (or emitter-follower) transistor MN1 (of FIG. 1) and the common-source (or common-emitter) transistor MN2 (of FIG. 1) of the main output branch. Transistors MP3 and MP4 of the first amplifier 101 provide a current source to the input pair transistors MP1 and MP2 while transistors MN1 and MN2 provide active loads to the input pair transistors MP1 and MP2.

Transistors MN3, MN4, MN5, MN6, MP7, MP8, MP5, and MP6 form the rest of the first stage of the first amplifier 101, which in this embodiment is a folded-cascode stage. Transistors MN8, MN10, and MP9 form a second gain stage in amplifier 101, which provides additional gain to the amplifier, sets up the correct bias voltage for the first transistor MN1 (of FIG. 1) of the main output branch, and decouples the gate voltage of the first transistor MN1 (of FIG. 1) from the quiescent output voltage of the first stage of amplifier 101. In one embodiment, the current density of the bias transistor in the second stage of amplifier 101—transistor MN10—of the first amplifier 101 is matched to the current density through transistors MN1 (of FIG. 1) and MN2 (of FIG. 1) of the main output branch. The capacitor Cc is the compensation capacitor of the first amplifier 101. Transistor MN9 and MN7 form a feedback source-follower to prevent a feedforward-zero through Cc.

In one embodiment, the second amplifier 102 comprises an n-type differential amplifier with input transistors MN1 and MN2. One reason for selecting n-type differential amplifier with input transistors MN1 and MN2 is high input common-mode voltage of amplifier 102, which is a result of the small voltage drop through the first resistor 108 and second resistor 109 between the supply and the inputs of second amplifier 102. In one embodiment, the transistors MN5 and MN6 of the second amplifier 102 are matched with the source-follower transistor MN1 (first transistor of FIG. 1) and the common-source transistor MN2 (second transistor of FIG. 1), thus minimizing effects of process variations. Transistors MN3 and MN4 of the second amplifier 102 provide a current source to the input pair transistors MN1 and MN2 while transistors MP1, MP2, MP3, and MP4 provide a high impedance to the drain nodes of first and second transistors MN1 and MN2 (of FIG. 1), which forces the signal current through the cascode devices MP5 and MP6. Transistors MP5 and MP6 form cascode devices that level shift the high quiescent voltages at the drain terminals of the input devices MN1 and MN2 to the low quiescent voltage needed at the drains of MN5 and MN6.

Figure 3:
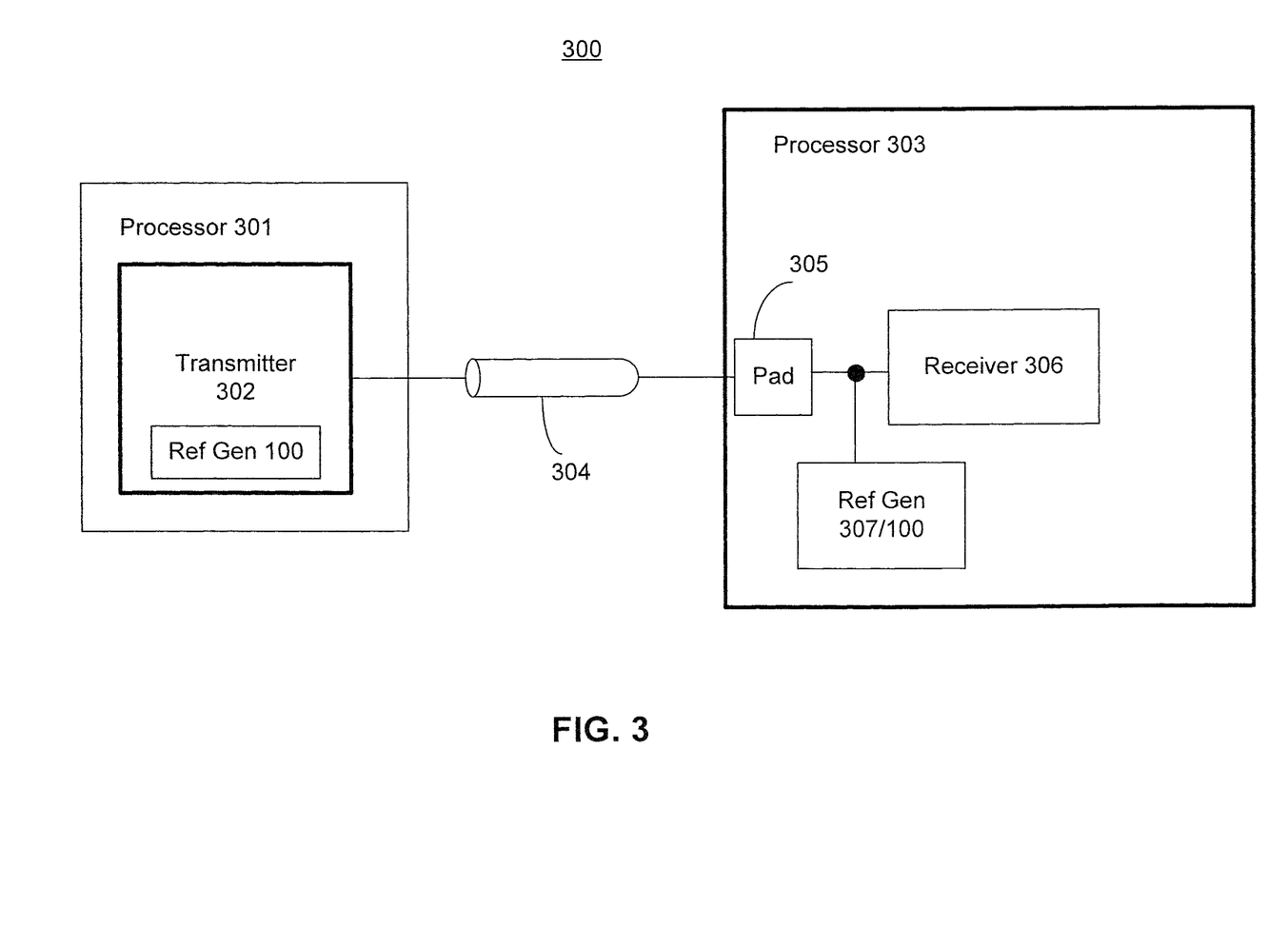
FIG. 3 is an input-output (I/O) system using the low-impedance reference voltage generator, according to one embodiment of the disclosure.

FIG. 3 is an input-output (I/O) system 300 using the low-impedance reference voltage generator 100, according to one embodiment of the disclosure. In one embodiment, the system 300 includes a processor 301 coupled to processor 303 via a differential transmission media 304. In one embodiment, the transmission media 304 is a single-ended transmission media. In one embodiment, the low-impedance reference voltage generator 100 is used to provide a low-impedance reference voltage for the I/O transmitter 302. In one embodiment, the low-impedance reference voltage generator 100/307 is coupled to a receiver 306 to provide a low-impedance common-mode (CM) reference voltage with CM return loss of −6 dB over a frequency range of zero to 4 GHz and a CM return loss of −3 dB over frequencies of 4 GHz. In such an embodiment, the output node Vo is coupled to termination resistances as shown in FIG. 1, wherein the output node is also coupled to the I/O pad 305 and the receiver 306. In other embodiments, the low-impedance reference generator 100 may be used for any circuit that requires a low-impedance reference voltage.

FIG. 4 is a circuit of a low-impedance reference voltage generator 400, according to another embodiment of the disclosure. The embodiment of FIG. 4 is similar to the embodiment of FIG. 1 except that the design is flipped. FIG. 4 is a p-type implementation of the n-type based low-impedance reference voltage generator 100 of FIG. 1.

In this embodiment, the first n-type transistor MN1 (n-type source-follower) of FIG. 1 is replaced with p-type source-follower (or emitter-follower) transistor MP1 while the second n-type transistor MN2 (n-type common-emitter) of FIG. 1 is replaced with p-type common-source (or common-emitter) transistor MP2. In one embodiment, the first amplifier 401 is implemented with n-type differential input pair transistors while the second amplifier 402 is implemented with p-type differential input pair transistors.

In this embodiment, the first capacitor Cc2 is coupled like the first capacitor Cc2 of FIG. 1. In this embodiment, the second capacitor Cb has a first node coupled to the output of the first amplifier 401 while the second node of the second capacitor Cb is coupled to ground or a supply node. The first resistor 408 and second resistor 409 in this embodiment are coupled between ground terminals and input nodes of the second amplifier 402. In one embodiment, the first resistor 408 and second resistor 409 are implemented as pass-transistors as shown. In other embodiments, other forms of linear resistors may be used. The embodiment of FIG. 4 provides a higher reference voltage than the reference voltage achieved from embodiment of FIG. 1.

Figure 5:
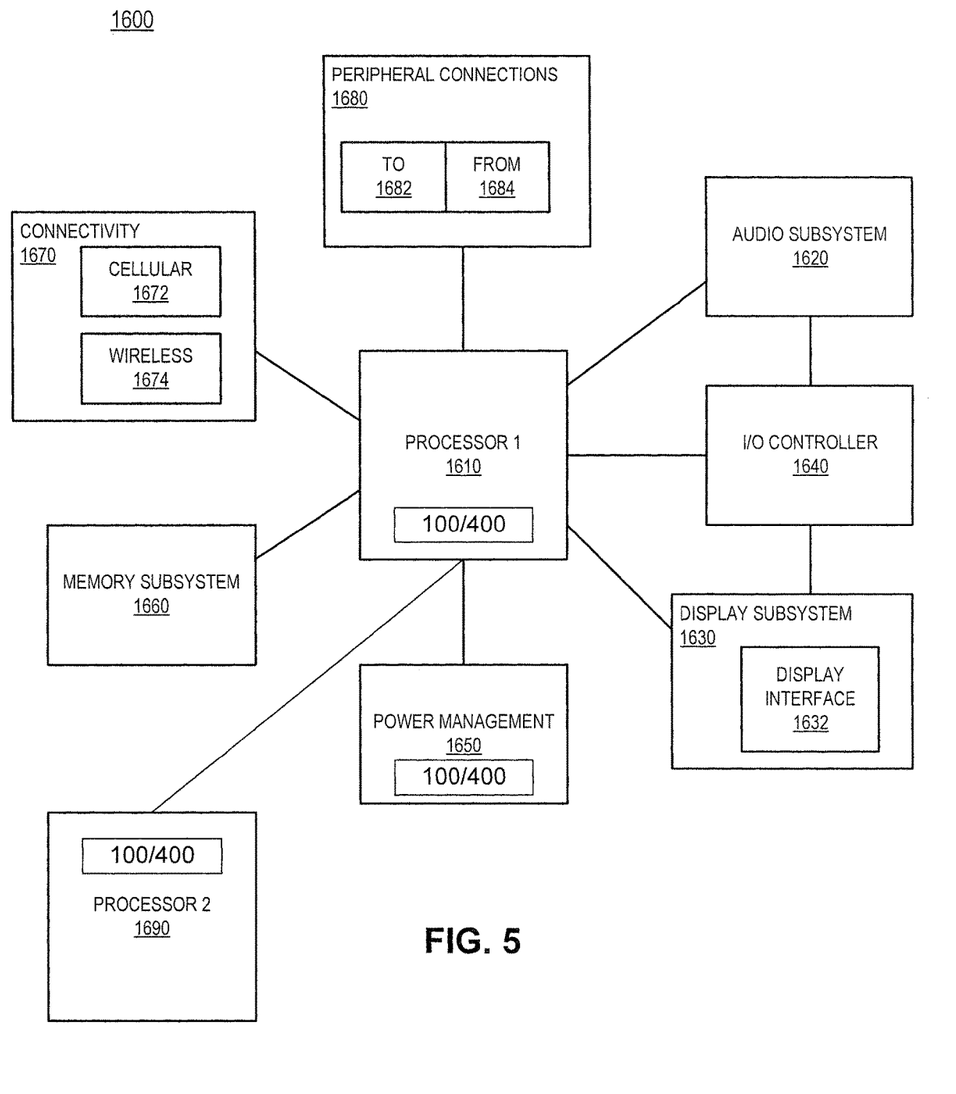
FIG. 5 is a system-level diagram of a smart device comprising a processor with the low-impedance reference voltage generator, according to one embodiment of the disclosure.

FIG. 5 is a system-level diagram of a smart device 1600 comprising a processor with the low-impedance reference voltage generator 100/400, according to one embodiment of the disclosure. FIG. 5 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the circuit 100/400 and a second processor 1690 with the circuit 100/400, according to the embodiments discussed herein.

The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The low-impedance reference voltage generator 100 iscussed herein can be used for wireless circuits and analog circuits in general, where noise is a concern on bias lines, for example. In one embodiment, the low-impedance reference voltage generator 100 discussed herein can be used as a push-pull voltage regulator. In one embodiment, the low-impedance reference voltage generator 100 is used in blocks 1670, 1680, 1620, 1640, and 1630.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, the apparatus comprises: a voltage-control loop including a first transistor to provide an output voltage; and a current-control loop to sense current through the first transistor, relative to a reference current. In one embodiment, the current-control loop comprises a second transistor, coupled in series with the first transistor, the second transistor to provide the constant current through the first and second transistors.

In one embodiment, the apparatus further comprises a first capacitor including: a first node coupled to an output of a second amplifier of the current-control loop. In one embodiment, the first capacitor further comprises a second node coupled to a terminal of the first transistor. In one embodiment, the first node of the first capacitor is coupled to an input of the second transistor. In one embodiment, wherein the second node of the first capacitor is coupled to a terminal of the second transistor. In one embodiment, the apparatus further comprises: a second capacitor with a first node coupled to an output of a first amplifier of the voltage-control loop and input of the second transistor, and a second node coupled to a supply node or ground.

In one embodiment, the first transistor is a source or emitter follower. In one embodiment, the second transistor is a common-source or emitter transistor. In one embodiment, the current-control loop is operable to keep power consumption of the apparatus substantially constant.

In another example, the apparatus comprises: a first amplifier to provide an output voltage relative to a reference voltage, via a first transistor coupled to the first amplifier; and a second amplifier to cause a constant current, through the first transistor, relative to a reference current. In one embodiment, the second amplifier is operable to generate an input signal for a second transistor, coupled in series with the first transistor, the second transistor to provide the constant current through the first and second transistors. In one embodiment, the first transistor is a source-follower or emitter-follower, and wherein the second transistor is a common-source or common-emitter transistor.

In one embodiment, the apparatus of claim 11 further comprises a first capacitor including: a first node coupled to an output of the second amplifier and input of the second transistor; and a second node coupled to a terminal of the first transistor and a terminal of the second transistor. In one embodiment, the second node of the first capacitor is coupled to an input of the first amplifier, the second node of the first capacitor providing a reference voltage. In one embodiment, the apparatus further comprises a second capacitor including: a first node coupled to an output of the first amplifier and an input of the first transistor; and a second node coupled to a supply node or ground.

In one embodiment, the apparatus further comprises a first resistor including: a first node coupled to a first input of the second amplifier and a terminal of the first transistor, and a second node coupled to a supply node. In one embodiment, the apparatus further comprises a second resistor including: a first node coupled to a second input of the second amplifier and a reference current generator that provides the reference current, and a second node coupled to a supply node.

In another example, the apparatus comprises: means for providing a low-impedance output voltage via a voltage-control loop coupled to a current-control loop, wherein the current-control loop is operable to keep power consumption of the apparatus substantially constant.

In one example, the system comprises: a processor having a reference generator according to the apparatus discussed herein; and a wireless antenna to communicatively link the processor to a wireless network. In one embodiment, the reference generator is operable to provide at least one of: a common mode voltage for termination resistors of an input-output (I/O) receiver, or a reference voltage for an I/O transmitter. In one embodiment, the I/O receiver is a PCIe I/O receiver.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
a first amplifier having a first input node and a second input node, wherein the first input node is to receive a reference voltage, and wherein the second input node is to provide a low impedance reference;
a first capacitive device coupled to an output of the first amplifier and a first supply node;
a first transistor having a gate terminal coupled to the output of the first amplifier, a source terminal connected to the second input node; and a drain terminal coupled to a first resistive device;
a second amplifier having a first node coupled to the drain terminal of the first transistor, and a second node coupled to a second resistive device;
a second capacitive device coupled to an output of the second amplifier and the second input node; and
a second transistor having a gate terminal coupled to the output of the second amplifier, a source terminal coupled to a second supply node; and a drain terminal coupled to the second input node.

2. The apparatus of claim 1 comprises a reference current source coupled to the second node of the second amplifier, and coupled to the second supply node.

3. The apparatus of claim 1, wherein the first and second resistive devices are coupled to the first supply node.

4. The apparatus of claim 1, wherein the first amplifier is a folded-cascode amplifier.

5. The apparatus of claim 1, wherein the second amplifier is a differential amplifier.

6. The apparatus of claim 1 comprises a receiver which has an input coupled to the second input node.

7. The apparatus of claim 1, wherein at least one of the first and second resistive devices comprise:
an n-type transistor with a gate terminal coupled to a ground node; and
a p-type transistor with a gate terminal coupled to a supply node, the n-type transistor coupled in parallel with the p-type transistor.

8. The apparatus of claim 1, wherein the first and second transistors are p-type transistors, wherein the first amplifier is a p-input folded cascade amplifier, and wherein the second amplifier is an n-type differential amplifier.

9. The apparatus of claim 1, wherein the first and second transistors are n-type transistors, wherein the first amplifier is an n-input folded cascade amplifier, and wherein the second amplifier is an p-type differential amplifier.

10. The apparatus of claim 1, wherein the first transistor is a source-follower or an emitter-follower, and wherein the second transistor is a common-source or common-emitter transistor.

11. A system comprising:
a transmitter;
a transmission media coupled to the transmitter; and
a receiver coupled to the transmission media, wherein at least one of the transmitter or receiver includes:

a first amplifier having a first input node and a second input node, wherein the first input node is to receive a reference voltage, and wherein the second input node is to provide a low impedance reference;

a first capacitive device coupled to an output of the first amplifier and a first supply node;

a first transistor having a gate terminal coupled to the output of the first amplifier, a source terminal connected to the second input node; and a drain terminal coupled to a first resistive device;

a second amplifier having a first node coupled to the drain terminal of the first transistor, and a second node coupled to a second resistive device;

a second capacitive device coupled to an output of the second amplifier and the second input node; and a second transistor having a gate terminal coupled to the output of the second amplifier, a source terminal coupled to a second supply node; and a drain terminal coupled to the second input node.

12. The system of claim 11 comprises: a wireless antenna to communicatively link a processor having the receiver to a wireless network.

13. The system of claim 12 comprises a display interface for allowing a display unit to display content processed by the processor.

14. The system of claim 11, wherein the first and second transistors are p-type transistors, wherein the first amplifier is a p-input folded cascade amplifier, and wherein the second amplifier is an n-type differential amplifier.

15. The system of claim 11, wherein the first and second transistors are n-type transistors, wherein the first amplifier is an n-input folded cascade amplifier, and wherein the second amplifier is an p-type differential amplifier.

16. The system of claim 11, wherein the first transistor is a source-follower or an emitter-follower, and wherein the second transistor is a common-source or common-emitter transistor.

17. An apparatus comprising:

a folded-cascode amplifier having a first input node and a second input node, wherein the first input node is to receive a reference voltage, and wherein the second input node is to provide a low impedance reference;

a first capacitive device coupled to an output of the folded-cascode amplifier and a first supply node;

a first transistor having a gate terminal coupled to the output of the folded-cascode amplifier, a source terminal connected to the second input node; and a drain terminal coupled to a first resistive device;

a differential amplifier having a first node coupled to the drain terminal of the first transistor, and a second node coupled to a second resistive device;

a second capacitive device coupled to an output of the differential amplifier and the second input node; and a second transistor having a gate terminal coupled to the output of the differential amplifier, a source terminal coupled to a second supply node; and a drain terminal coupled to the second input node.

18. The apparatus of claim 17, wherein the first and second transistors are n-type transistors, wherein the first amplifier is an n-input folded cascade amplifier, wherein the second amplifier is an p-type differential amplifier or wherein the first transistor is a source-follower or an emitter-follower, and wherein the second transistor is a common-source or common-emitter transistor.

19. An apparatus comprising:

means for applying transconductance of output transistors of a reference generator; and means for decreasing quiescent current in the output transistors.

20. The apparatus of claim 19 comprises:

means for decoupling the output transistors from a bias voltage.

* * * * *